(12) United States Patent
Kizilyalli et al.

(10) Patent No.: US 9,330,918 B2
(45) Date of Patent: May 3, 2016

(54) EDGE TERMINATION BY ION IMPLANTATION IN GALLIUM NITRIDE

(71) Applicant: Avogy, Inc., San Jose, CA (US)

(72) Inventors: Isik C. Kizilyalli, San Francisco, CA (US); Hui Nie, Cupertino, CA (US); Andrew P. Edwards, San Jose, CA (US); Linda Romano, Sunnyvale, CA (US); David P. Bour, Cupertino, CA (US); Richard J. Brown, Los Gatos, CA (US); Thomas R. Prunty, Santa Clara, CA (US)

(73) Assignee: Avogy, Inc., San Jose, CA (US)

( * ) Notice: Subject to any disclaimer, the term of this patent is extended or adjusted under 35 U.S.C. 154(b) by 0 days.

(21) Appl. No.: 14/558,393

(22) Filed: Dec. 2, 2014

(65) Prior Publication Data

US 2015/0200097 A1  Jul. 16, 2015

Related U.S. Application Data

(62) Division of application No. 13/301,165, filed on Nov. 21, 2011, now Pat. No. 8,927,999.

(51) Int. Cl.

| H01L 21/265 | (2006.01) |
| H01L 29/66 | (2006.01) |
| H01L 29/808 | (2006.01) |
| H01L 29/868 | (2006.01) |
| H01L 29/872 | (2006.01) |
| H01L 29/06 | (2006.01) |
| H01L 29/20 | (2006.01) |

(52) U.S. Cl.
CPC ........ *H01L 21/2654* (2013.01); *H01L 29/0619* (2013.01); *H01L 29/0642* (2013.01); *H01L 29/2003* (2013.01); *H01L 29/6631* (2013.01); *H01L 29/66143* (2013.01); *H01L 29/66446* (2013.01); *H01L 29/66856* (2013.01); *H01L 29/8083* (2013.01); *H01L 29/868* (2013.01); *H01L 29/872* (2013.01)

(58) Field of Classification Search
CPC ....... H01L 21/329; H01L 29/15; H01L 29/20; H01L 29/868; H01L 29/872; H01L 29/66446; H01L 29/66462; H01L 21/265; H01L 29/06; H01L 29/66; H01L 29/66143; H01L 21/2654
See application file for complete search history.

(56) References Cited

U.S. PATENT DOCUMENTS

| 5,041,393 | A | 8/1991 | Ahrens et al. | |
| 5,266,506 | A | 11/1993 | Green | |
| 6,235,617 | B1 | 5/2001 | Kawai | |
| 8,927,999 | B2 | 1/2015 | Kizilyalli et al. | |
| 2005/0029533 | A1* | 2/2005 | Wu et al. | 257/99 |
| 2005/0145851 | A1* | 7/2005 | Johnson et al. | 257/76 |
| 2005/0194584 | A1* | 9/2005 | Slater et al. | 257/13 |
| 2005/0285126 | A1* | 12/2005 | Wu et al. | 257/94 |
| 2005/0285155 | A1 | 12/2005 | Johnson et al. | |

(Continued)

*Primary Examiner* — Tan N Tran
*Assistant Examiner* — Fazli Erdem
(74) *Attorney, Agent, or Firm* — Kilpatrick Townsend & Stockton LLP (57) ABSTRACT

A method of making an edge terminated semiconductor device includes providing a GaN substrate having a GaN epitaxial layer grown thereon and exposing a portion of the GaN epitaxial layer to ion implantation. The energy dose is selected to provide a resistivity that is at least 90% of maximum achievable resistivity. The method also includes depositing a conductive layer over a portion of the implanted region.

12 Claims, 9 Drawing Sheets

(56) References Cited

U.S. PATENT DOCUMENTS

| | | |
|---|---|---|
| 2006/0148156 A1 | 7/2006 | Gunter et al. |
| 2007/0235768 A1* | 10/2007 | Nakazawa et al. ............ 257/211 |
| 2009/0026499 A1 | 1/2009 | Kikawa et al. |
| 2010/0032685 A1 | 2/2010 | Zhang et al. |
| 2010/0052014 A1 | 3/2010 | Matsushita |
| 2011/0284865 A1* | 11/2011 | Inoue et al. ..................... 257/76 |
| 2012/0007097 A1 | 1/2012 | Hebert |
| 2013/0015552 A1 | 1/2013 | Kizilyalli et al. |
| 2013/0126888 A1 | 5/2013 | Kizilyalli et al. |
| 2013/0129885 A1 | 5/2013 | Disney et al. |
| 2013/0248884 A1 | 9/2013 | Beach et al. |

* cited by examiner

EDGE TERMINATION BY ION IMPLANTATION IN GALLIUM NITRIDE

CROSS-REFERENCES TO RELATED APPLICATIONS

This application is a division of U.S. patent application Ser. No. 13/301,165, filed Nov. 21, 2011, the entirety of which is hereby incorporated by reference.

FIELD OF THE INVENTION

The present invention relates to edge termination in devices. In particular, the present invention relates to edge termination of devices experiencing high electric field at their otherwise untreated edges. More particularly, the present invention relates to edge termination suitable for use in GaN devices.

BACKGROUND OF THE INVENTION

In order to achieve the maximum possible voltage handling capability of a metal-semiconductor Schottky barrier contact, the contact should approach its behavior as if it were an infinite parallel plane. Such a theoretical structure would have a uniform electric field at its interface, increasing with applied voltage until it reaches the critical electric field for the onset of impact ionization in the underlying semiconductor. Since it is not possible to have an infinite extent in practice, and finite edges will exist with increased electric field due to curvature of equipotential lines at the contact corner leading to field crowding, the edge of the terminal must be treated in such a way as to make it behave as close to the ideal case as possible. One possible way to accomplish this is by reducing the potential distribution gradients and thus electric field. Another possibility is to alleviate the effect of the increase in electric field.

Various techniques such as doped guard rings, field plates, and mesa etching have been used for edge termination. Doped guard rings are difficult to form in GaN due to the high temperature activation anneal for implanted dopants, and the low diffusion rates of dopant species. Field plates improve the edge termination but do not approach the ideal parallel plane breakdown voltage. Mesa etching removes desirable planarity, and requires careful surface passivation to maintain stability of its effect. Mesa edge termination also falls short of the ideal breakdown voltage.

SUMMARY OF THE INVENTION

An edge termination technique is described which can be used to achieve improved breakdown voltage for GaN devices. This technique involves implanting a neutral species on the edges of devices to form a high-resistive layer. In accordance with the present invention, Schottky contacts and Schottky diodes having increased breakdown voltage are described.

In one or more embodiments, an insulating layer is created by ion implantation of a non-electrically active species to create lattice damage. Isoelectronic N implantation, for example, can be used to create an electrically isolating region encompassing the location of peak electric field. Such an isolating region will alleviate the onset of avalanche breakdown due to impact ionization.

In one embodiment, the implantation profile may consist of multiple implant energies and doses designed to result in a uniform concentration of the implant species to the desired depth. Such a profile will result in damage to the lattice throughout the implanted layer.

The dose is designed to create sufficient damage to result in high resistivity. One example is to implant isoelectronic N with 10-600 keV energies, with doses in the range of $10^{12}$ to $10^{14}$ cm$^{-2}$. Excessive damage can result in trap level assisted conduction and hence a less isolating region. A thermal anneal may be performed to the control the tail of the distribution, or for subsequent device processing steps, but not to the extent of repairing the desirable lattice damage for isolation purposes.

In one or more embodiments, the effectiveness of the implant edge termination can be increased by combination with a field plate. Such a field plate will serve to further decrease the electric field at the contact metal corner by spreading the field across an additional deposited dielectric.

In one aspect, an edge terminated semiconductor device includes a GaN substrate; a doped GaN epitaxial layer deposited on the GaN substrate comprising an ion-implanted insulation region, wherein the ion-implanted region has a resistivity that is at least 90% of maximum achievable resistivity and a conductive layer disposed over the GaN epitaxial layer, wherein the conductive layer overlaps a portion of the ion-implanted region.

In another aspect, an edge terminated semiconductor device includes a GaN substrate; a doped GaN epitaxial layer grown on the GaN substrate which includes an ion-implanted insulation region. The ion(s) used to create the ion-implanted region are selected from the group consisting of helium, argon, nitrogen or other elements and/or combinations thereof. A conductive layer is disposed over the GaN epitaxial layer, wherein the conductive layer overlaps a portion of the ion-implanted region.

In another aspect, an edge terminated semiconductor device, includes a GaN substrate; a doped GaN epitaxial layer deposited on the GaN substrate comprising an ion-implanted insulation region, wherein the ions are implanted to a depth of at least 400 nm, and a conductive layer disposed over the GaN epitaxial layer, wherein the conductive layer overlaps a portion of the ion-implanted region.

In one or more embodiments, the ion-implanted region has a depth of at least 400 nm.

In one or more embodiments, the ion-implanted region has a resistivity greater than $10^{10}$ ohm-sq.

In one or more embodiments, the GaN epitaxy layer is n-doped.

In one or more embodiments, the mean ion-implanted ion concentration is >$10^{18}$ cm-3.

In one or more embodiments, the ion-implanted region comprises a distribution of implanted ions.

In one or more embodiments, the conductive layer comprises a Schottky metal, and for example, the Schottky metal is selected from the group consisting of nickel, platinum, palladium and gold and combinations thereof.

In one or more embodiments, the conductive layer comprises p+ GaN.

In one or more embodiments, the overlap of the conductive layer over the ion-implanted insulation region is about 0.5 μm to about 10 μm.

In one or more embodiments, the implant ion comprises nitrogen.

In one or more embodiments, the device further includes an insulating layer disposed over the ion-implanted insulation region, wherein the conductive layer overlaps both a portion of the ion-implanted insulation region and a portion of the insulating layer.

In one or more embodiments, the device is a diode, and for example the diode is selected from the group of Schottky, PiN, PN, and merged PiN-Schottky diodes.

In one or more embodiments, the device is a field effect transistor and for example, the field effect transistor is a vertical junction field effect transistor.

In another aspect, a method of making an edge terminated semiconductor device includes providing a GaN substrate having a GaN epitaxial layer grown thereon; exposing a portion of the GaN epitaxial layer to ion implantation, wherein the energy dose is selected to provide a resistivity that is at least 90% of maximum achievable resistivity; and depositing a conductive layer over a portion of the implanted region.

In one or more embodiments, exposing the GaN epitaxy layer to ion implantation includes multiple implants at different energies and/or dosages selected to create a uniform layer of lattice damage.

In one or more embodiments, the multiple implants includes 2 or more implants at increasing energy and/or different doses.

In one or more embodiments, exposing the GaN epitaxy layer to ion implantation includes exposing the layer to one or more implants selected to provide an implant depth of greater than 450 nm.

In one or more embodiments, the implant ion is selected from the group consisting of nitrogen, argon, helium, other elements, and mixtures thereof.

In one or more embodiments, the conductive layer comprises a Schottky metal.

In one or more embodiments, the conductive layer comprises p+ GaN.

In one or more embodiments, the method further includes prior to depositing the conductive layer, depositing an insulating layer over the ion-implanted insulation region, wherein upon subsequent deposition of the conductive layer, the conductive layer overlaps both a portion of the ion-implanted insulation region and at least a portion of the insulating layer.

BRIEF DESCRIPTION OF THE DRAWINGS

The above and other objects and advantages of the present invention will be apparent upon consideration of the following detailed description, taken in conjunction with the accompanying drawings, in which like reference characters refer to like parts throughout, and in which.

DETAILED DESCRIPTION OF THE INVENTION

An electric field is set up between positively and negatively charged regions in a device. Under ideal conditions, the electric field at a planar junction will be uniform everywhere as if it is contained within an infinite parallel plane. Since it is not possible to have an infinite extent in practice, finite edges will exist with increased electric field due to crowding of equipotential lines at the contact corner.

Edge termination for devices having an elevated field region is described. Edge termination is accomplished using ion implanted neutral species on the edges of the device to form a resistive layer. A lightly doped region under the edges of the layer creating the electric field is used to shape the potential distribution, since the potential gradient is proportional to the doping level. The lower gradient of potential lowers the peak electric field at the junction. Placing lightly doped or insulating material under the edge of the layer creating the electric field also increases the critical field for onset of impact ionization compared to the semiconductor material that would otherwise exist in that location. Such an insulating layer can extend sufficiently far under and beyond the corner to encompass the entire elevated field region.

This technique is applicable to any device including regions of elevated electric field, which typically occur at the edge of devices. For example, it can be incorporated into devices having p-n junction layers or metal-semiconductor junction layers. In one or more embodiments, it can be incorporated into devices such as diodes, e.g., Schottky diodes, p-n diodes, pin diodes, etc. and transistors, e.g., FET, JFET, MOSFET etc. that include corners or localized potential gradients leading to higher electric field. In particular, the technique is particularly suitable for overcoming the processing and technological limitations of GaN devices.

Figure 4:
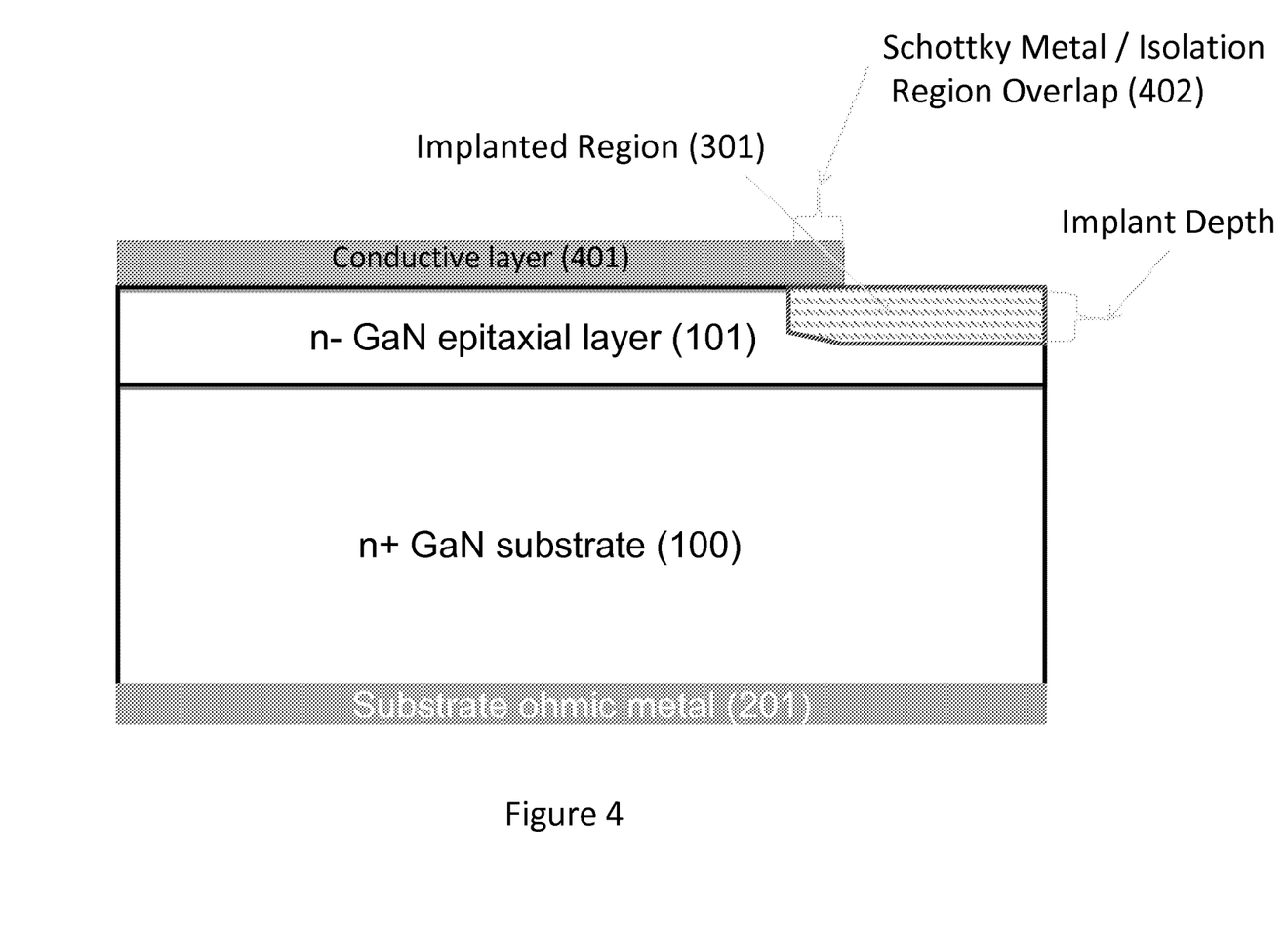
FIG. 4 is a cross-sectional view of a Schottky contact and insulating implant area according to one or more alternative embodiments.

FIG. 4 is a schematic illustration of GaN device including an implanted isolation region 301 according to one or more embodiments described herein. The implant depth is chosen to shape the potential distribution of the electric field under the conductive layer 401 and lower the maximum electric field as much as possible. The conductive layer can be a metal, such as used for example in a Schottky diode, or it can be a doped semiconductor layer, such as used for example in transistors and p-n diodes. The placement of conductive layer 401 over a portion 402 of the implanted region can be selected to lower the electric field at the plate edge or to contain the entire elevated field region under the maximum bias allowed and thereby increase the critical field for onset of impact ionization in the high field region.

One method of creating an insulating region is to use ion implantation of a non-electrically active species to create lattice damage. A damaged crystal lattice will contain allowed energy levels, or traps, within the forbidden energy gap of the perfect crystal. A large number of deep traps will make the region highly resistive. Excessive damage, however, can result in trap to trap conduction and reduce the resistance of the damaged region. A wide range of ions could be used to achieve this damage, such as nitrogen (N), helium (He), iron (Fe) or Argon (Ar). A preferred ion species for GaN is nitrogen (N) since it is isoelectronic, or already present in the target crystal. Isoelectronic N implantation into the GaN device layer can be used to create an electrically isolating region encompassing the location of peak electric field under the corner of the conductive contact as shown in FIG. 4.

Figure 1:
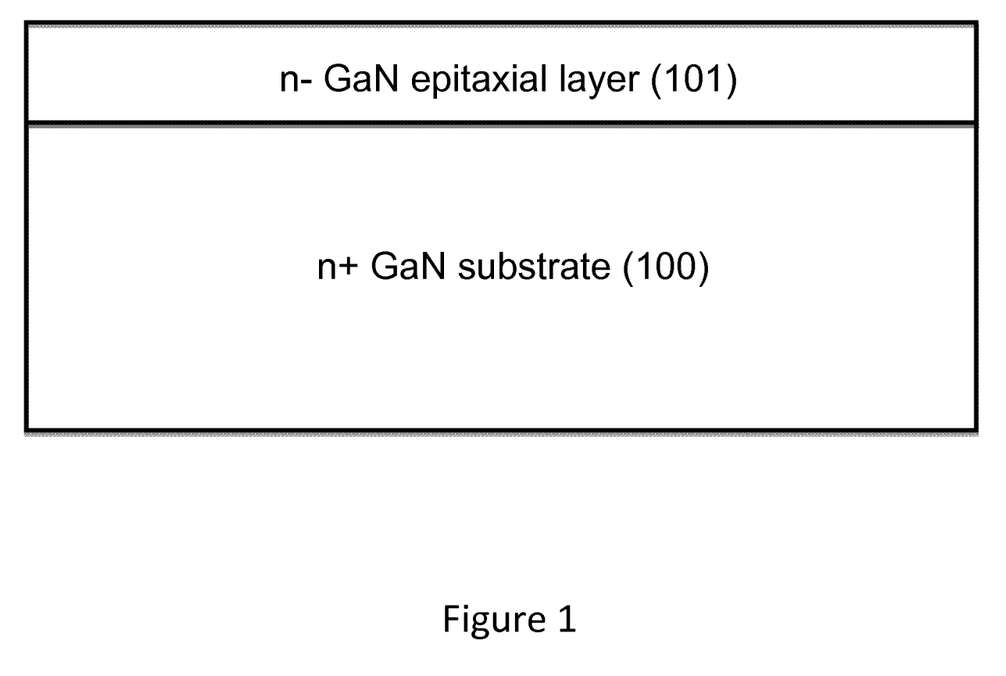
FIG. 1 is a cross sectional illustration of a GaN n+ substrate, including n– GaN epitaxial layer, for use in preparing the Schottky contact according to one or more embodiments described herein.

To fabricate the final device in FIG. 4, one starts with an n+GaN substrate (100) with a typical doping level of $10^{17}$-$10^{20}$ cm$^{-3}$ and a lightly doped n– epitaxial layer (101) as depicted in FIG. 1. The epitaxial layer doping may range from $10^{14}$ to $10\,17$ cm$^{-3}$, for example, and is typically n-type due to higher electron mobility for electrons in GaN. The dopant is typically Si for intentional doping, and well-known techniques for reducing the as-grown background components in GaN (which typically render it n-type with low net concentration) can also be used in preparing the epilayer. The thickness of the epitaxial layer is normally in the range of 1 μm to 100 μm, depending on the device design. The desired doping concentration and thickness is formed by epitaxial growth on a GaN substrate according to well-known techniques.

Figure 3:
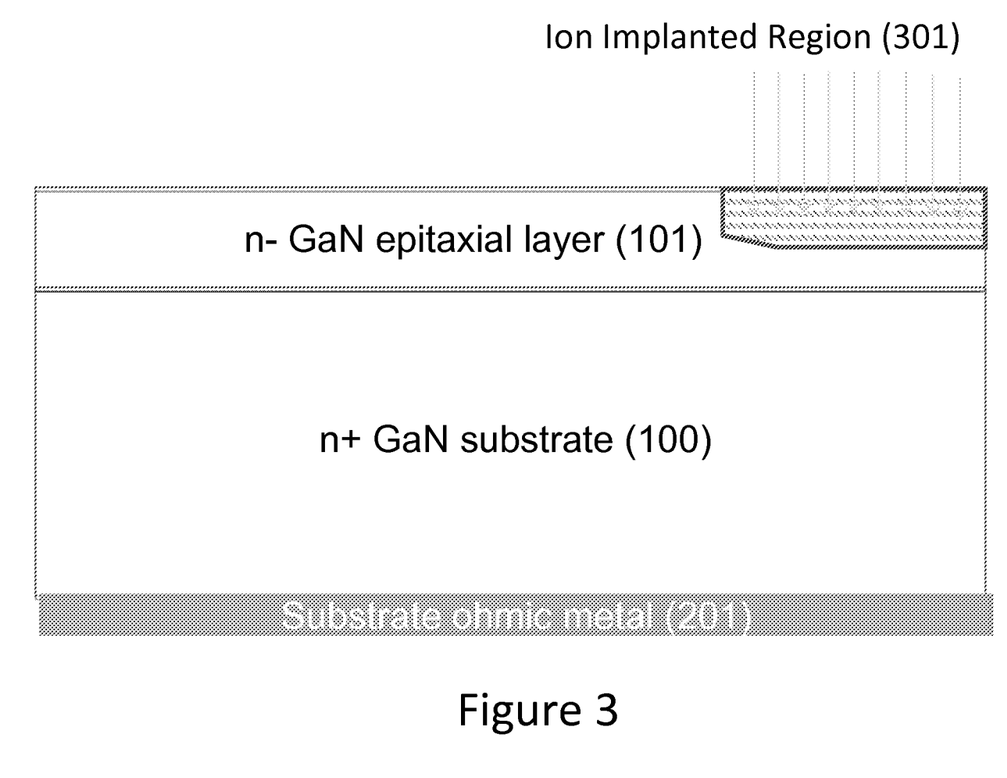
FIG. 3 is a cross sectional illustration of a GaN n+ substrate, including n– GaN epitaxial layer, illustrating formation of an ion implanted region according to one or more embodiments described herein.

FIG. 3 shows the location of ion implantation region (301) intended for edge termination of the final device. Implantation has an approximately Gaussian roll-off from the mask edge used to define its location, which is symbolized by the bevel edge in FIG. 3. The location of the implant is typically defined using a mask defined by photolithography. The mask material is capable of blocking the implanted species in areas where it is not desired.

Photoresist is patterned on the surface to define regions for ion implantation. The photoresist is designed to be thick enough to block the maximum energy implant from reaching the semiconductor surface. The implant is not blocked in the areas where photoresist has been removed. The purpose of the implantation is to form an electrically isolating layer.

Figure 7:
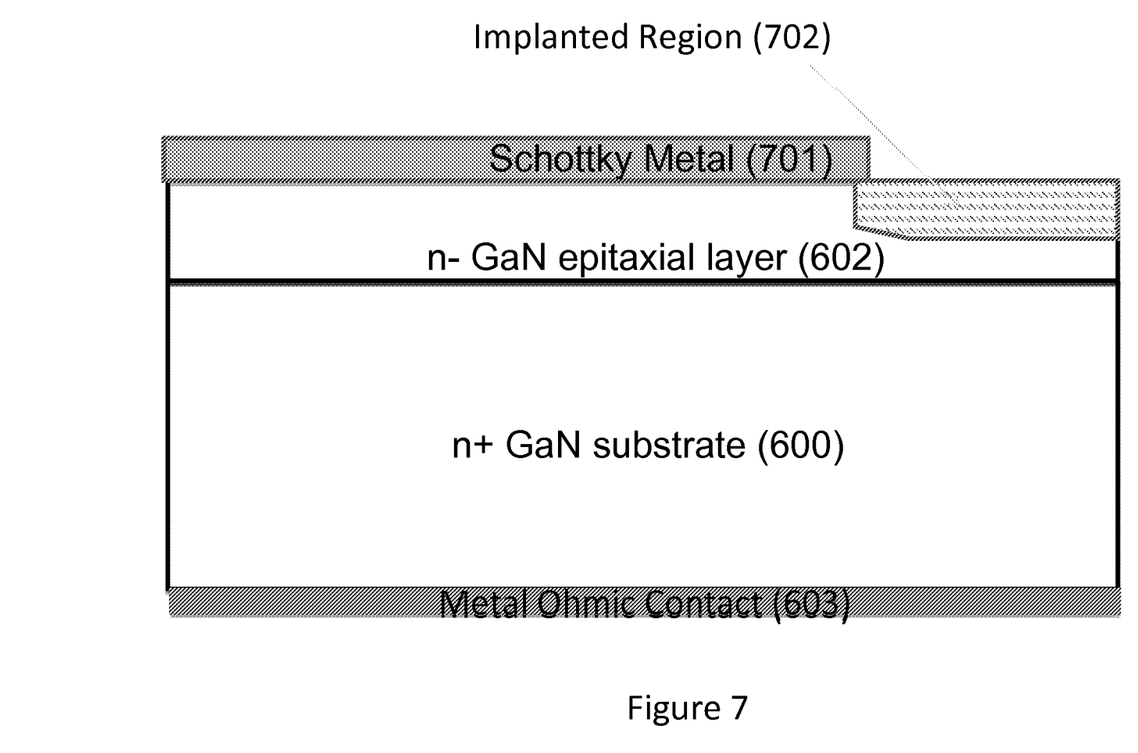
FIG. 7 is a cross sectional illustration demonstrating the use of a metal mask in the preparation of a Schottky contact or diode according to one or more embodiments.

Alternatively, the implant mask can be formed by patterning metal deposited on surface instead of photoresist. One example is to use nickel in place of photoresist for implantation mask. In some embodiments, the metal mask is a Schottky metal. FIG. 7 illustrates a Schottky metal layer (701) that has been deposited over the epitaxial GaN layer. In case of using the Schottky metal for an implant mask, the metal is not removed after implant. Implantation results in lateral spreading of the implant region underneath the edge of the overlaying conductive layer, so that the desired overlap of overlaying conductive layer and underlying implant isolation region is obtained.

The implanted species could consist of a wide range of ionized elements, but lightweight inert ions such as nitrogen or helium are preferred for greater penetration depth with implant energy. For example, at 400 keV the mean implantation depth for Argon is 0.2 μm in GaN, whereas the mean implant depth at the same energy is 0.5 μm for nitrogen and 1.1 μm for helium. The implanted layer could comprise multiple implants at different energies and doses designed to create a uniform layer of lattice damage. The dose should be designed to create sufficient damage to result in high resistivity, but not so high as to create excessive damage. The dosage regimen desirably produces an implanted region having at least 90% of maximum achievable resistivity. Maximum resistivity is readily determined for a given material by measurement over a range of implant energy doses. The maximum resistivity can vary for different materials and implanted elements, but typically is greater than $10^{10}$ ohm/sq. Exposure to dosage in excess of that which is sufficient to achieve maximum resistivity, leads to the creation of excessive deep traps and hopping conduction. The presence of additional damage indicative of exposure beyond that needed to achieve maximum resistivity is demonstrated by a high leakage current during operation of the device. Excessive lattice damage can also be inferred by observations using transmission electron microscopy (TEM), using Rutherford backscattering or SIMS measurements, for example.

In order to obtain an ion implanted isolation region having uniform lattice damage, the region can be treated with multiple ion implants at different doses. The summation of the Gaussian-like distributions can be designed to result in a nearly uniform concentration from near the surface to the maximum implant depth. One example of an implantation recipe for helium intended to create a uniform concentration 1.5 μm thick isolation layer include four implant energies of 20 keV, 60 keV, 160 keV, 400 keV with $6.8 \times 10^{13}$ cm$^{-2}$, $1.8 \times 10^{14}$ cm$^{-2}$, $3.1 \times 10^{14}$ cm$^{-2}$, and $4.3 \times 10^{14}$ cm$^{-2}$ dose, respectively.

A thermal anneal may be performed to control the tail of the distribution. Thermal anneal can repair lattice damage and can be used to refine the location of the implanted region. By partial annealing, the lightly damaged tail of the Gaussian distribution of damage can be repaired while the heavily damaged region is relatively untouched. The thermal anneal should not repair the implant region to the extent of repairing the desirable lattice damage introduced for isolation purposes. Such an isolating region will alleviate the onset of avalanche breakdown due to impact ionization, by lowering the maximum electric field present, and by increasing the critical field for breakdown.

Referring now to FIG. 4, the final processing step consists of deposition and patterning of the conductive layer. The placement of conductive layer 401 over a portion of the implanted region is designed to contain the entire elevated field region under the maximum bias allowed on the device.

In some embodiments, the conductive layer can be a metal and the device is a Schottky diode. The Schottky metal (401) is typically Nickel, Platinum, Palladium, or Gold, which are metals known to form a relatively high (>0.9 eV) Schottky barrier on GaN. The metal is patterned to overlap the implanted isolation region to an extent which will encompass the elevated electric field region at the corner of the metal. The metal overhang is a function of the anticipated electric field flux (excursion) and is typically in the range of 0.5-10 μm. The anticipated field excursion can be determined, for example, using simulation or models and the material overhang can be selected to enclose the predicted field excursion. The Schottky metal layer thickness is typically >0.2 μm, or greater than 0.5 μm, but the metal stack may be as thick as desired.

In other embodiments, the conductive layer can be a GaN p+ layer, and the junction is a p-n junction. Devices including p-n junctions include PIN diodes, merged P-i-N/Schottky diodes, transistor structures such as MOSFET, JFET and IGBT and other devices such as thyristors as will be evident to those skilled in the art.

Figure 2:
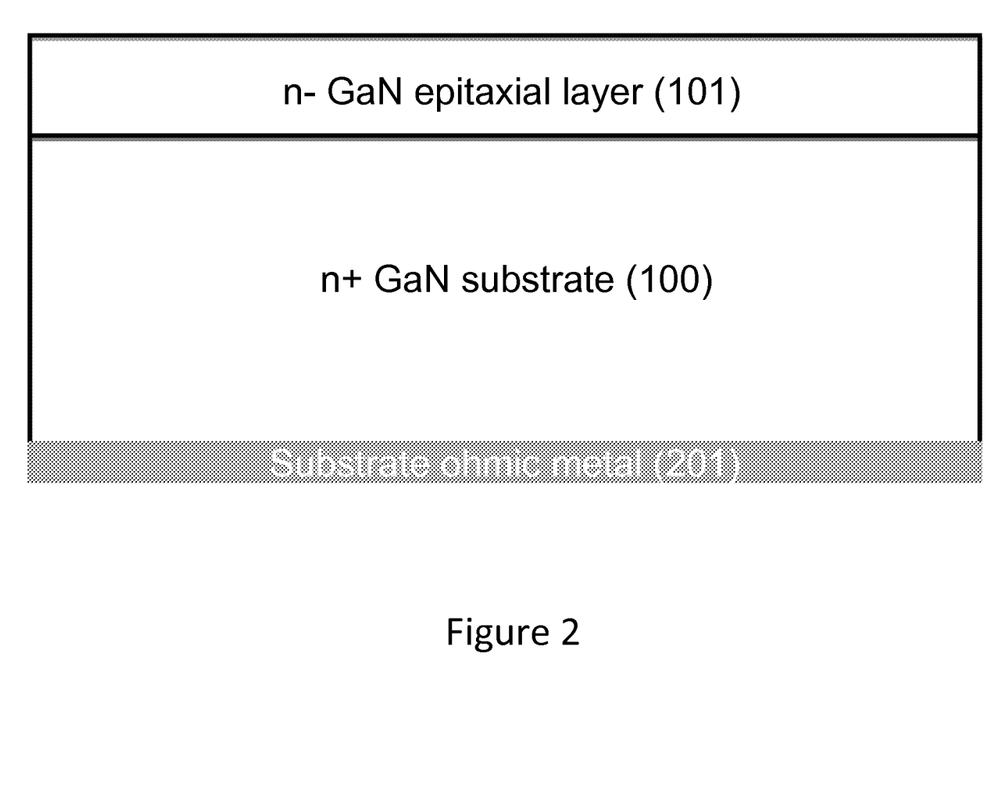
FIG. 2 is a cross sectional illustration of a GaN n+ substrate, including n– GaN epitaxial layer, with a blanket Ohmic contact formed on the substrate.

A backside Ohmic contact (201) is also deposited and annealed. The contact is generally Ti/Al based and annealed at >700° C. for >5 min, but other possibilities exist. See, FIG. 2.

The edge termination method is a relatively simple processing step involving only an implant mask, the ion implantation itself, and mask removal. This method also maintains the planarity of the device. Non-planarity introduces complexity for subsequent processing steps. This method is effective as part of a solution which can increase breakdown voltage to a value approaching that of an infinite parallel plane diode, unlike many of the alternatives. This technique also has the advantage of being compatible with GaN, while many standard silicon process techniques such as selective area doping, oxidation, and wet etching are not readily available.

In another aspect, a vertical GaN-on-GaN Schottky diode with an ion-implanted edge termination region is described. A Schottky barrier is a potential barrier formed at a metal-semiconductor junction which has rectifying characteristics. Schottky barriers are incorporated into Schottky diodes and transistors, as well as other devices. When the metal and n-type semiconductor contact one another, some of the electrons in the semiconductor (which are at a higher energy) move spontaneously into the metal and collect on the surface. These leave behind ionized donor locations, which are positively charged, and create a space charge region in the semiconductor. An electric field is set up between these positive charges and the electrons and a barrier is created that eventually inhibits further electron flow into the metal. This barrier and electric field are increased when negative bias is applied to the metal. The maximum reverse bias voltage that can be applied to a diode is limited by breakdown. Breakdown is characterized by the rapid increase of the current under reverse bias. The corresponding applied voltage is referred to as the breakdown voltage. The breakdown voltage is an important parameter of power devices; however, it is also relevant to logic and other devices.

A GaN Schottky diode will outperform competitors in Si and SiC due to the outstanding material properties of GaN. Homoepitaxial GaN layers on bulk GaN substrates are imbued with superior properties to other materials being used and considered for power electronic devices. High electron mobility, $\mu$, is predicted for a given background doping level, N, which implies low resistivity, $\rho$, since $\rho=1/q\mu N$. Another outstanding property is that of high critical electric field, $E_{crit}$, for avalanche breakdown. A high critical electric field allows large voltages to be supported over smaller length, L, than a material with lesser $E_{crit}$. A shorter distance for current to flow and a low resistivity give rise to a lower resistance, R, than high voltage devices in a less favorable material since $R=\rho L/A$. In general, there is a tradeoff between the physical dimension needed to support high voltage in the device's off-state, and the ability to pass current through the same region with low resistance in the on-state. Several figures of merit have been developed to represent this tradeoff, with GaN shown to beat all viable competitors.

GaN layers grown on bulk GaN substrates have low defect density compared to layers grown on mismatched substrates. The low defect density will give rise to superior thermal conductivity, and is also expected to result in less trap related effects such as dynamic on-resistance. One way to take advantage of these properties is with a Schottky barrier diode.

The Schottky diode is formed by an interface between lightly n-type doped GaN and a metal with a larger work function than the GaN such as Nickel, Palladium, Platinum or Gold. Lightly doped n-type GaN is chosen for its superior electron mobility compared to that of holes in a p-type material. The work function difference forms a rectifying barrier which can surmounted by applying forward bias, but blocks current in reverse bias up to a maximum voltage determined by the properties of the GaN epitaxial layer, provided edge termination is provided. The forward current is due to majority carrier flow, so there are no minority carrier storage effects as there are in a p-n junction.

For power devices, a vertical structure often has advantages over lateral one in improving current density and breakdown voltage. A vertical current flow GaN Schottky diode has favorable trade-offs between resistance, thermal conductivity and high voltage operation. In order to fully utilize high critical electrical field of GaN material, special care is needed to design the Schottky metal contact, especially at the metal corner on n-type GaN material to avoid an excessive electrical field during high voltage operation.

Figure 6:
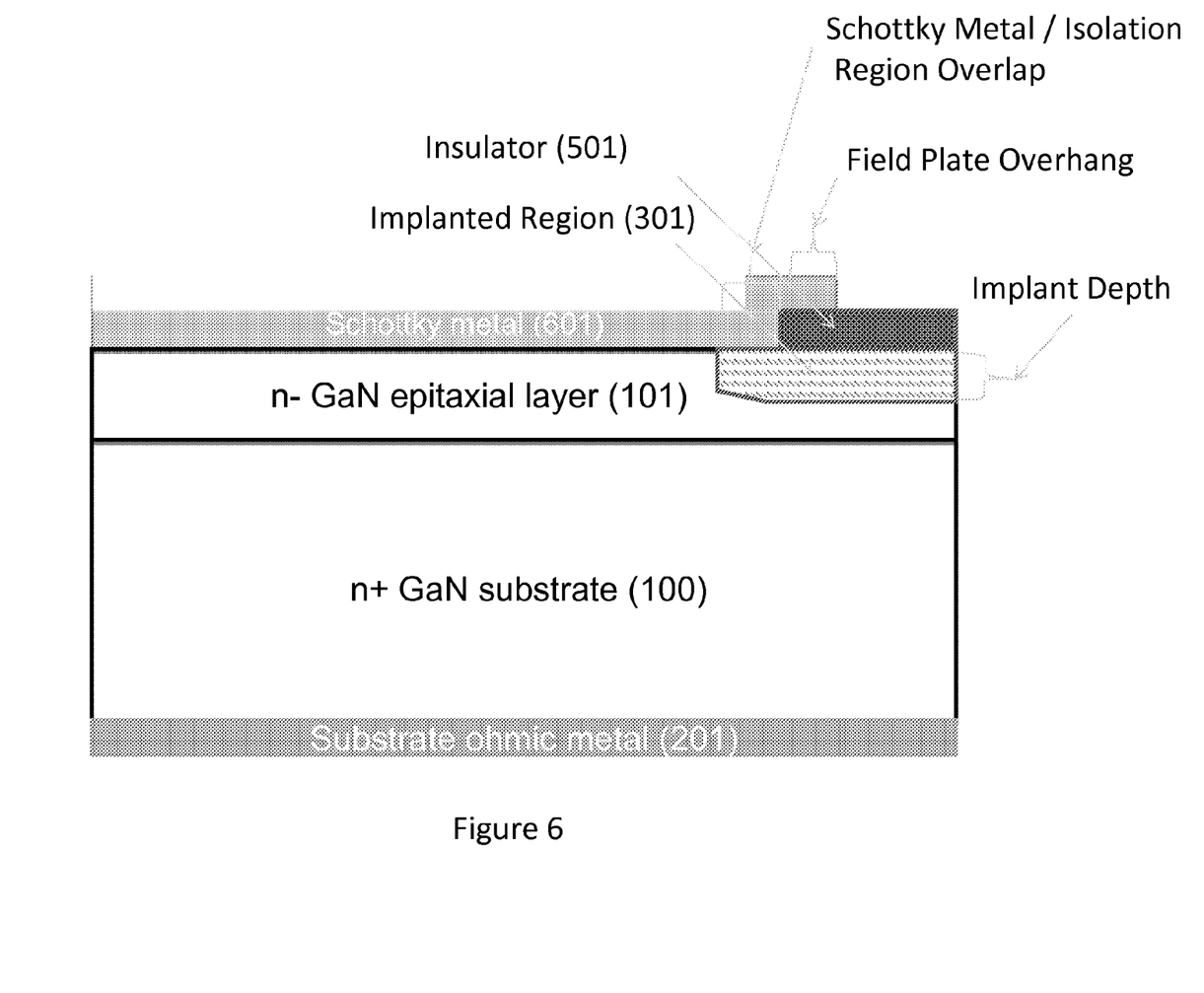
FIG. 6 is a cross section of GaN-based vertical Schottky diode with combined field plate and ion implanted edge termination in accordance with certain embodiments of the present invention.

A vertical GaN-on-GaN Schottky diode with combined ion-implanted edge termination region and field plate is shown in FIG. 6. By combining an ion-implanted edge termination layer (301) and insulator layer (501), the corner electrical field between Schottky metal contact layer (601) and n-type GaN epitaxial layer (101) can be further alleviated compared to prior art devices. The implant depth is chosen to shape the potential distribution under the Schottky contact and lower the maximum electric field as much as possible. The placement of Schottky metal 601 over a portion of the implanted region 301 is designed to contain the entire elevated field region under the maximum bias allowed on the Schottky contact.

The effectiveness of the implant edge termination can be increased by combination with a field plate formed by overlapping a Schottky metal 601 over a deposited insulator 501, as shown in FIG. 6. The additional features in this embodiment over that of FIG. 4 are the field plate overhang and the field plate height. The field plate height is determined by the thickness of insulating layer 501. Such a field plate will serve to further decrease the electric field at the contact metal corner by spreading the field across an additional deposited dielectric. The appropriate field plate overhang and plate thickness are determined by simulation or experiment to minimize the electric field at the Schottky metal corner by shaping the potential distribution and spreading the electric field. In addition the insulating material can typically withstand a higher electric field than the semiconductor without breaking down.

To fabricate the final device in FIG. 6, one starts with an+ GaN substrate with a typical doping level of $10^{17}$-$10^{20}$ cm$^{-3}$, and an n− epitaxial layer, as depicted in FIG. 1. In other embodiments, p-doped GaN can be used for the epitaxial layer. The epitaxial layer doping may range from $10^{14}$ to $10^{18}$ cm$^{-3}$, for example, and is typically n-type due to higher electron mobility for electrons in GaN. The thickness of the epitaxial layer is normally in the range of 1 μm to 100 μm, depending on the device design. A backside ohmic contact (201) is also deposited and annealed. The contact is generally Ti/Al based and annealed at >700° C. for >5 min. Further details are presented above in discussion of FIG. 4.

The epitaxial layer is treated to form the high resistivity region intended for edge termination of the final device as described previously. The location of the implant is defined by using a mask defined by photolithography. The mask material is capable of blocking the implanted species in areas where it is not desired. The implanted species could consist of a wide range of ionized elements, but less massive, inert ions such as nitrogen and helium are preferred. The implanted layer could be composed of multiple implants at different energies, typically 10-600 keV, and doses, typically $10^{12}$ to $10^{15}$ cm$^{-2}$, designed to create a uniform layer of lattice damage. One example of an implantation recipe for helium comprised of four implant energies to create a uniform concentration 1.5 μm thick isolation layer is 20 keV, 60 keV, 160 keV, 400 keV with $6.8\times10^{13}$ cm$^{-2}$, $1.8\times10^{14}$ cm$^{-2}$, $3.1\times10^{14}$ cm$^{-2}$, and $4.3\times10^{14}$ cm$^{-2}$ dose, respectively. The dose should be designed to create sufficient damage to result in high resistivity, but not so high as to create excessive damage. A thermal anneal may be performed to the control the tail of the distribution, or in subsequent processing steps, but not to the extent of repairing the desirable lattice damage for isolation purposes. Such an isolating region will alleviate the onset of avalanche breakdown due to impact ionization, by lowering the maximum electric field present, and by increasing the critical field for breakdown. Further details are presented above in discussion of FIG. 3.

Figure 5:
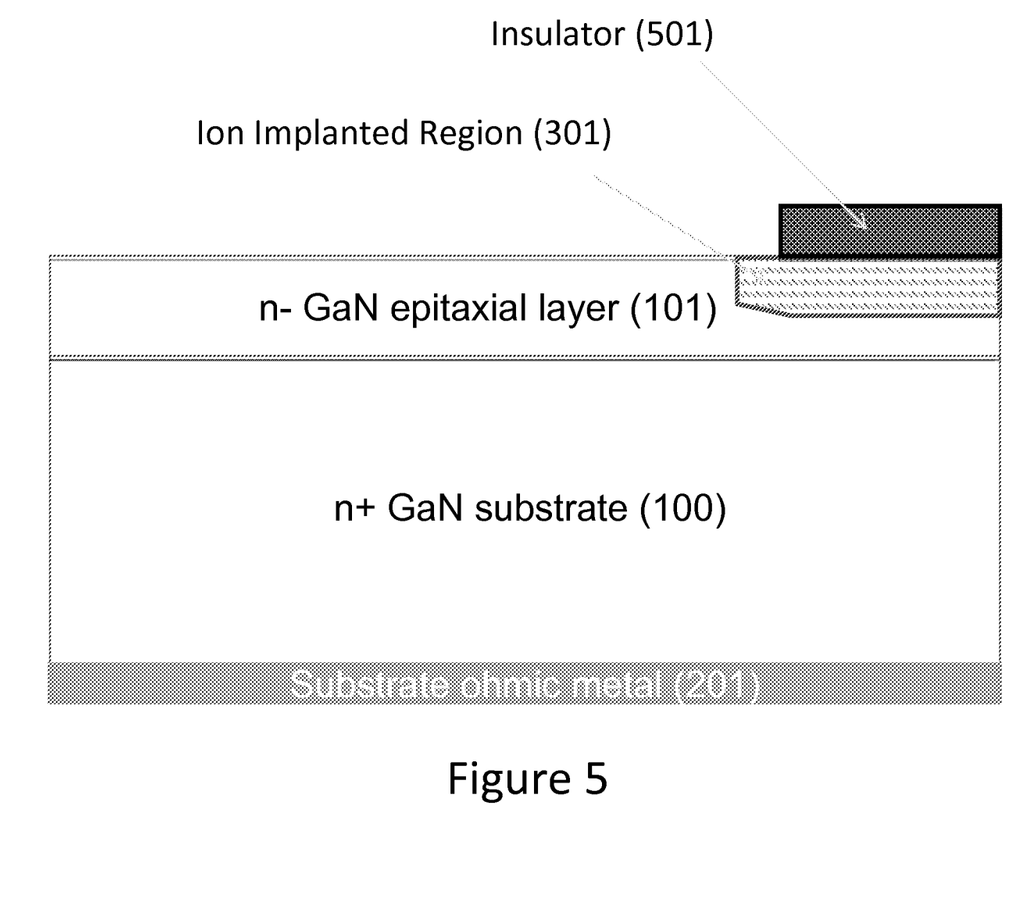
FIG. 5 is a cross sectional illustration of a GaN n+ substrate, including n– GaN epitaxial layer and ion implanted region, onto which an insulating layer is deposited, according to one or more embodiments described herein.

The next processing step involves deposition and patterning of an insulator (501), as illustrated in FIG. 5. The insulator material may be $SiN_x$ or $SiO_x$, or a number of other acceptable insulating materials. The insulator thickness is chosen to determine the field plate height created by later Schottky metal deposition. The insulator is patterned to define the edge of the Schottky barrier and is located sufficiently far inside the implanted region to contain the high electric field at the Schottky metal corner. Typically the insulator is set back about 1-5 μm from the edge of the implanted region.

The final processing step consists of deposition and patterning of the Schottky metal (601), as shown in FIG. 6. The placement of Schottky metal 601 over a portion of the implanted region is designed to contain the entire elevated field region when subjected to the maximum bias allowed on the Schottky contact. Typically the Schottky metal is Nickel, Platinum, Palladium, or Gold, which are metals known to form a relatively high (>0.9 eV) Schottky barrier on GaN. The metal is patterned to overlap the deposited insulator layer to an extent which is designed to minimize electric field present at the corner of the metal that is contacting the implanted semiconductor region. The combination of the alleviation of the electric field by the field plate and the properties of the implanted layer described earlier are expected to combine and allow near parallel plane breakdown properties for the final device.

Figure 8:
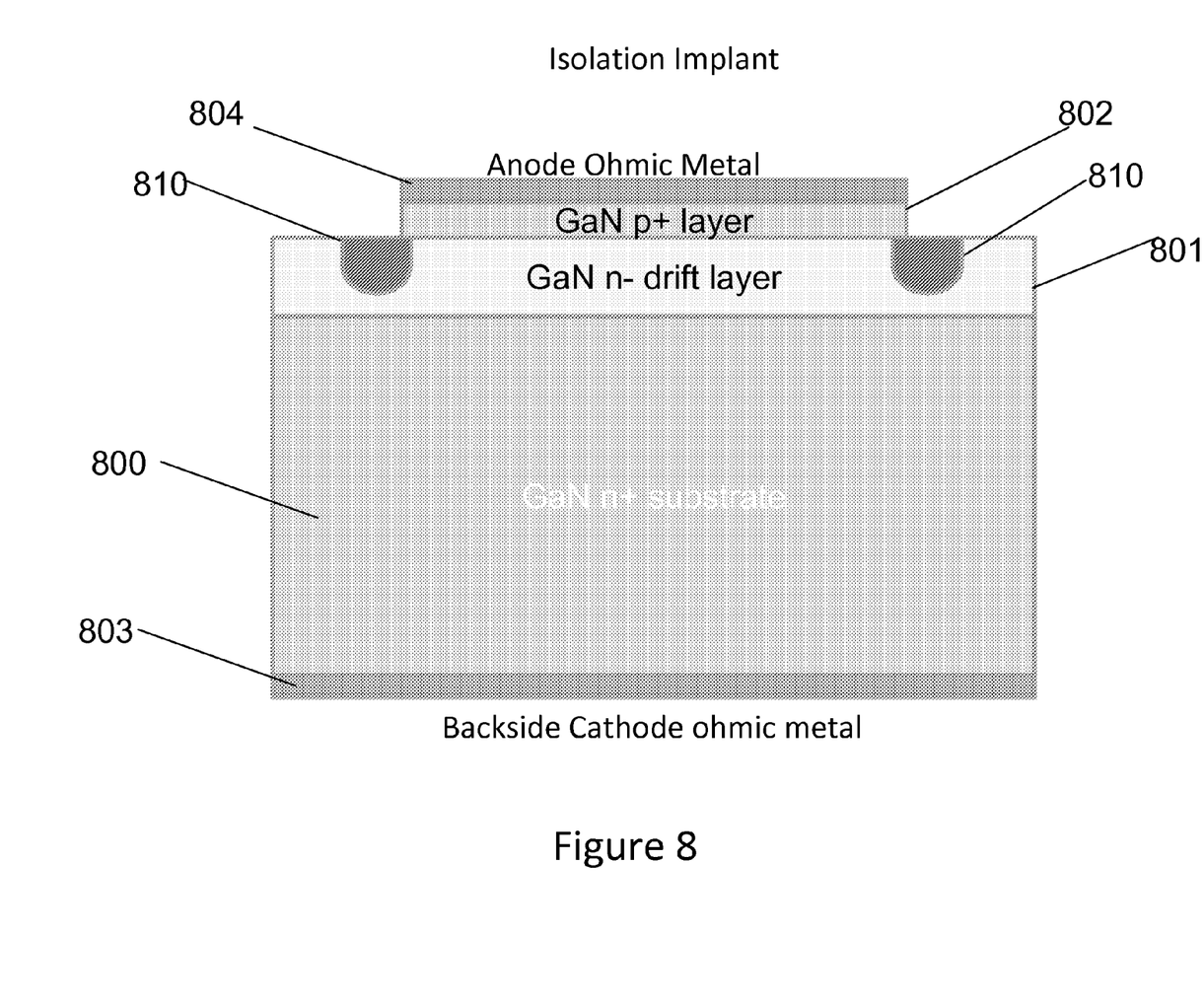
FIG. 8 is a cross-sectional view of a PIN diode according to one or more embodiments of the invention.

Diodes can also be formed using GaN with opposite polarities, e.g. p-type and n-type, in which the electric field is generated at the interface between highly doped (e.g., dopant concentrations of greater than $10^{17}$ $cm^{-3}$) and a lighter doped layer of the opposite doping type. The electric fields generated at the interface can be alleviated by edge termination. In one or—more embodiments, an edge termination is provided for a PIN diode in the region below the p+GaN edge. With reference to FIG. 8, a PIN diode according to one or more embodiments is described. The PIN diode include an n+GaN substrate (800) with a typical doping level of $10^{17}$ $10^{20}$ $cm^{-3}$ and a lightly doped (intrinsic) n– epitaxial layer (801). The epitaxial layer doping may range from $10^{14}$ to $10^{17}$ $cm^{-3}$, for example, and is typically n-type due to higher electron mobility for electrons in GaN. The dopant is typically Si for intentional doping, and well-known techniques for reducing the as-grown background components in GaN (which typically render it n-type with low net concentration) can also be used in preparing the epilayer. The thickness of the epitaxial layer is normally in the range of 1 μm to 100 μm, depending on the device design. The desired doping concentration and thickness is formed by epitaxial growth on a GaN substrate according to well-known techniques.

A p+ GaN layer (802) with a typical doping level of $10^{17}$-$10^{20}$ $cm^{-3}$ overlays the intrinsic layer and can be patterned using conventional masking and etching techniques, or formed by selective regrowth upper and lower Ohmic contact metal layers (803, 804) are deposited to provide electrical contact to the device. According to one or more embodiments, an ion implanted region (810) is located below the edge of the conductive p+ GaN layer. The implanted species could consist of a wide range of ionized elements, but lightweight inert ions such as nitrogen or helium are preferred for greater penetration depth with implant energy. For example, at 400 keV the mean implantation depth for Argon is 0.2 μm in GaN, whereas the mean implant depth at the same energy is 0.5 μm for nitrogen and 1.1 μm for helium. The implanted layer could be comprised of multiple implants at different energies and doses designed to create a uniform layer of lattice damage. The dose should be designed to create sufficient damage to result in high resistivity, but not so high as to create excessive damage. The dosage regimen desirably produces an implanted region having at least 90% of maximum achievable resistivity. Maximum resistivity is readily determined for a given material by measurement over a range of implant energy doses. The maximum resistivity can vary for different materials and implanted elements, but typically is greater than $10^{10}$ ohm/sq.

In order to obtain an ion implanted isolation region having uniform lattice damage, the region can be treated with multiple ion implants at different doses. The summation of the Gaussian-like distributions can be designed to result in a nearly uniform concentration from near the surface to the maximum implant depth. One example of an implantation recipe for helium intended to create a uniform concentration 1.5 μm thick isolation layer includes four implant energies of 20 keV, 60 keV, 160 keV, 400 keV with $6.8 \times 10^{13}$ $cm^{-2}$, $1.8 \times 10^{14}$ $cm^{-2}$, $3.1 \times 10^{14}$ $cm^{-2}$ and $4.3 \times 10^{14}$ $cm^{-2}$ dose, respectively.

A thermal anneal may be performed to control the tail of the distribution. Thermal anneal can repair lattice damage and can be used to refine the location of the implanted region. By partial annealing, the lightly damage tail of the Gaussian distribution of damage can be repaired while the heavily damaged region is relatively untouched.

In other embodiments, the edge termination is incorporated into field effect transistors having at least one p-n junction. The high electric field or electric field spikes arising at the corner of the p-region are alleviated by introduction of a high resistivity region under the corner of the p region.

Figure 9:
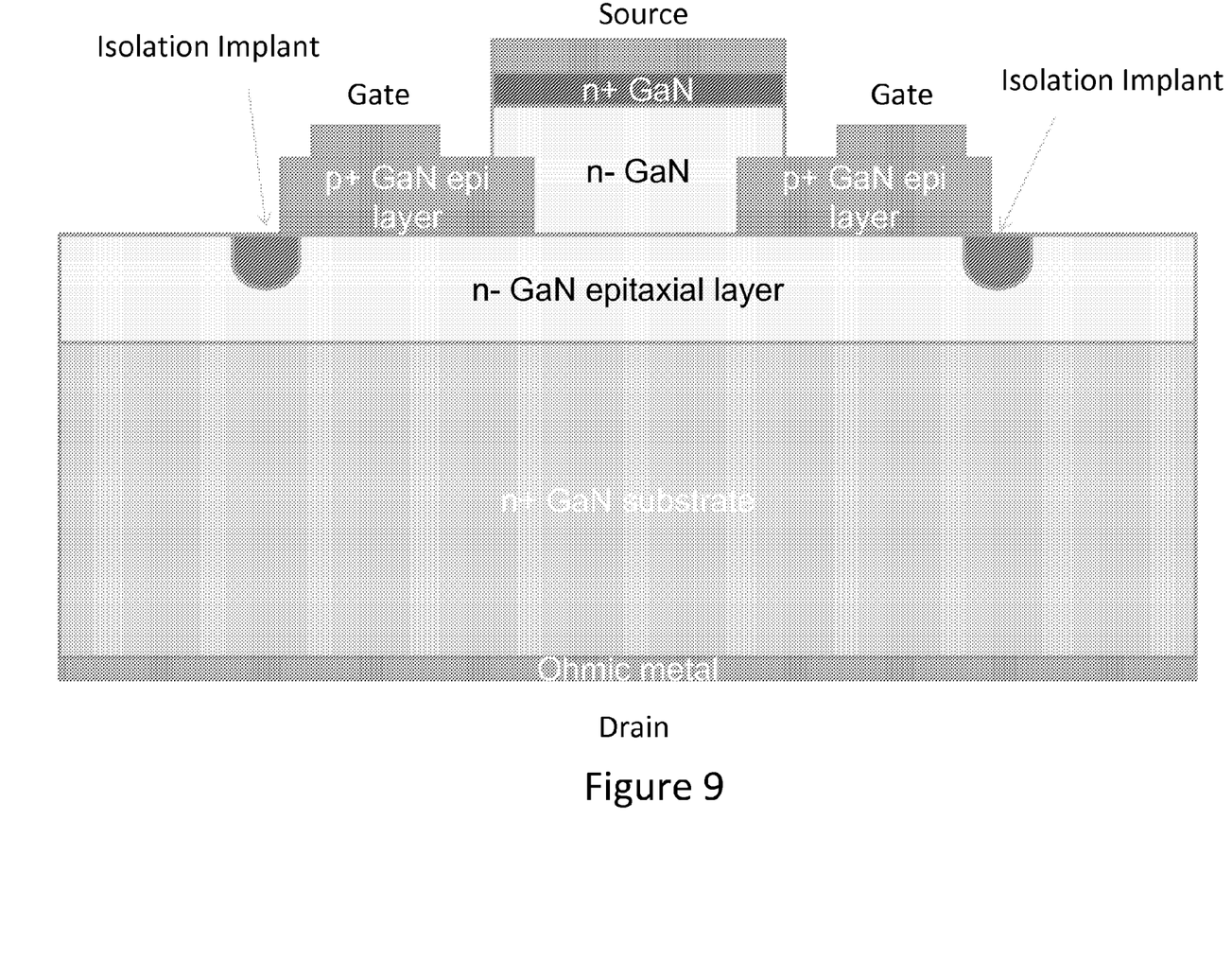
FIG. 9 is a cross-sectional view of an implant edge termination for vertical junction field effect transistor (FET) according to one or more embodiments of the invention.

FIG. 9 illustrates a vertical junction field effect transition (VJFET) that includes an n+ GaN substrate with a typical doping level of $10^{17}$-$10^{20}$ $cm^{-3}$ and a lightly doped (intrinsic) n-epitaxial layer with doping ranging from $10^{14}$ to $10^{17}$ $cm^{-3}$, for example. A p+ GaN layer with a typical doping level of $10^{17}$-$10^{20}$ $cm^{-3}$ overlays the intrinsic layer to form gate and drain electrodes Ann-doped channel including a lightly doped n– (intrinsic) layer and a highly doped n+ layer spans the gate and source electrodes. The FET controls the flow of electrons (or holes) from the source to drain by electrically modulating a conducting channel using voltage (or lack of voltage) applied across the gate and source terminals. According to one or more embodiments, an ion implanted region is located below the edge of the conductive p+ GaN layers making up the source and drain electrodes. The implanted species could consist of a wide range of ionized elements, but lightweight inert ions such as nitrogen or helium are preferred for greater penetration depth with implant energy. For example, at 400 keV the mean implantation depth for Argon is 0.2 μm in GaN, whereas the mean implant depth at the same energy is 0.5 μm for nitrogen and 1.1 μm for helium. The implanted layer could be comprised of multiple implants at different energies and doses designed to create a uniform layer of lattice damage. The dose should be designed to create sufficient damage to result in high resistivity, but not so high as to create excessive damage. The dosage regimen desirably produces an implanted region having at least 90% of maximum resistivity.

Such devices can be prepared using conventional techniques as are known in the art, and with consideration of the discussion above.

Upon review of the description and embodiments of the present invention, those skilled in the art will understand that modifications and equivalent substitutions may be performed in carrying out the invention without departing from the essence of the invention. Thus, the invention is not meant to be limiting by the embodiments described explicitly above, and is limited only by the claims which follow.

What is claimed is:

1. A method of making an edge terminated semiconductor device, comprising:
   providing a GaN substrate having a GaN epitaxial layer grown thereon;
   exposing a portion of the GaN epitaxial layer to ion implantation to form an implanted region, wherein the energy dose is selected to provide a resistivity of the implanted region that is at least 90% of maximum achievable resistivity;
   forming an insulating layer on the implanted region while leaving a portion of the implanted region exposed; and
   depositing a conductive layer over the exposed portion of the implanted region and a portion of the insulating layer.

2. The method of claim 1, wherein exposing the GaN epitaxial layer to ion implantation comprises multiple implants at different energies and/or dosages selected to create a uniform layer of lattice damage.

3. The method of claim 2, wherein the multiple implants comprises two or more implants at increasing energy and/or different doses.

4. The method of claim 1, wherein exposing the GaN epitaxial layer to ion implantation comprises exposing the GaN epitaxial layer to one or more implants selected to provide an implant depth of greater than 450 nm.

5. The method of claim 1, wherein the implant ion is selected from the group consisting of nitrogen, argon, helium, or other elements, and mixtures thereof.

6. The method of claim 1, wherein the conductive layer comprises a Schottky metal.

7. The method of claim 1, wherein the conductive layer comprises p+ GaN.

8. The method of claim 1, wherein an overlap of conductive layer over the exposed portion of the implanted region is about 0.5 μm to about 10 μm.

9. The method of claim 1, wherein the resistivity is greater than $10^{10}$ Ohms/sq.

10. The method of claim 1, wherein the GaN epitaxial layer is n-doped.

11. The method of claim 1, wherein the implanted region comprises a distribution of implanted ions.

12. The method of claim 2, wherein the multiple implants comprise a mean ion-implanted ion concentration greater than $10^{18}$ cm$^{-3}$.

* * * * *